United States Patent
Hu et al.

(10) Patent No.: US 8,358,726 B2
(45) Date of Patent: Jan. 22, 2013

(54) METHOD FOR SOURCE SYNCHRONOUS HIGH-SPEED SIGNAL SYNCHRONIZATION

(75) Inventors: Junquiang Hu, Davis, CA (US); Tyrone Kwok, Cupertino, CA (US); Ting Wang, Cupertino, CA (US)

(73) Assignee: NEC Laboratories America, Inc., Princeton, NJ (US)

( * ) Notice: Subject to any disclaimer, the term of this patent is extended or adjusted under 35 U.S.C. 154(b) by 225 days.

(21) Appl. No.: 12/814,371

(22) Filed: Jun. 11, 2010

(65) Prior Publication Data

US 2011/0304369 A1    Dec. 15, 2011

(51) Int. Cl.
*H04L 7/00* (2006.01)
(52) U.S. Cl. ........ 375/354; 375/224; 375/226; 375/367; 375/368; 375/371; 370/503; 370/508; 370/509; 370/510; 370/511; 370/512; 370/513; 370/514; 455/502; 455/516; 327/141; 327/161; 327/163
(58) Field of Classification Search .................. 375/224, 375/226, 354, 367, 368, 371; 455/516, 502; 370/508, 509, 510, 511, 512, 513, 514, 503; 327/141, 161, 163
See application file for complete search history.

(56) References Cited

U.S. PATENT DOCUMENTS

| | | | | |
|---|---|---|---|---|
| 6,728,240 | B1 * | 4/2004 | Dally et al. | 370/366 |
| 7,743,288 | B1 * | 6/2010 | Wang | 714/704 |
| 2002/0191719 | A1 * | 12/2002 | Hasako et al. | 375/346 |

OTHER PUBLICATIONS

V. Devunuri, SFI-4.1 16-Channel SDR Interface with Bus Alignment Using Virtex-6 FPGAs. Xilinx application notes xapp880, http://www.xilinx.com/support/documentation/application_notes/xapp880.pdf, Feb. 2010.
AD9734/AD9735/AD9736 datasheet, Analog Devices. http://www.analog.com/static/imported-files/data_sheets/AD9734_9735_9736.pdf.

* cited by examiner

*Primary Examiner* — Leon Flores
(74) *Attorney, Agent, or Firm* — Joseph Kolodka; Bao Tran

(57) ABSTRACT

A source synchronous signal synchronization system includes a differential signal receiver; a tunable input delay element coupled to the receiver; an input serializer/deserializer (ISerDes) coupled to the tunable input delay; an alignment unit coupled to the ISerDes; and a delay control unit coupled to the tunable input delay, the ISerDes, and the alignment unit.

17 Claims, 6 Drawing Sheets

METHOD FOR SOURCE SYNCHRONOUS HIGH-SPEED SIGNAL SYNCHRONIZATION

BACKGROUND

The present invention is related to device input/output delay calibration and signals alignment in a source synchronous, delay adjustable hardware system.

Source-Synchronous clocking refers to the technique of sourcing a clock along with the data. Specifically, the timing of unidirectional data signals is referenced to a clock (often called the strobe) sourced by the same device that generates those signals. In receiving device, the data is sampled by the accompanying clock edge. To correctly sample the input data, clock edge must fall at the clear-open eye of the data signal.

Some devices such as certain Analog Devices digital-to-analog converters assume the parallel data signals have overlapped opening-eye time period, and data are also aligned with clock signal. That is, the clock edge is also the transition time for data, while the high or low level of clock is aligned with opening-eye of data signals. The solution tunes the clock delay only to have the clock edge fall at the overlapped data window; no special data alignment procedure is needed.

In high-speed cases, the clear-open eye is relatively small. Due to I/O delay variation, the clock edge may fall at the data transition period (i.e., changing from 1 to 0 or 0 to 1) which may result in incorrect sampling, or received signal with high bit error ratio (BER). Moreover, trace routing length difference also add uncertainty to this problem. Even though the signal length can be controlled during PCB layout, imposing strict rules will make layout more difficult.

Some devices with high-speed interface provide I/O with tunable delay, so that the window can be adjusted to let the clock edge sample correctly. This feature makes data alignment possible, but proper alignment is still a problem. Due to I/O delay and trace length uncertainty, even if each data can be adjusted to have the clock edge fall at the center of its open-eye, in some signals one or more bits can be aligned in different windows which is usually not acceptable.

When high-speed I/O is connected to a deserializer, where the deserializer provides bit-level slipping function for word alignment, if the inputs are not aligned to exact the same window, the deserializer output may also result in one word misalignment.

FIG. 1 shows elements of an example device input interface. LVDS (low-voltage differential signal) inputs RX_P and RX_N are coupled to LVDS receiver 102, which outputs positive signal D+ and negative signal D−. The two output signals from 102 are connected to tunable input delay blocks 104 and 106 respectively. The output from each delay block is coupled to an ISerDes (input serializer/deserializer) 108 or 110, which is essentially flip-flops plus control logic, to function as a demultiplexers (DeMux).

The tunable delay blocks 104 and 106 delay their corresponding inputs to a configurable number of taps, so that the signal can be adjusted to have center of its open-eye moved to the clock edge, to guarantee correct signal detection.

ISerDes has clock inputs clk and clk_div, to trigger input serial data, and latch parallel output, respectively. Bitslip signal is provided in each ISerDes to slip the N-bit parallel output for different alignment. For example, by generating a bitslip pulse, for input sequence "a, b, c, d, e, f, g, h, . . . ", with 1:4 ISerDes, possible aligning modes are shown in FIG. 2.

With example input interface elements mentioned above, one solution for misalignment problem uses a training sequence, such as 4'b1001 in the 1:4 ISerDes case of FIG. 2. This solution includes a data window centering process, and a parallel output word alignment. Data window centering is based on the fact that with given training sequence, the output is expected to be stable in case the clock edge falls at the open-eye. The data window centering process further contains three steps. First the process looks for the first transition tap and pass through this period. The principle is to compare the current parallel output with the older one after increasing the delay by one tap. If different, it is in the transition tap. The process keeps on increasing the taps to reach a stable window where no bit changes during a given period. Second the process searches for the end of open-eye with same approach, and third the process returns to the center of the open-eye from the knowledge of the searched beginning and ending tap.

Parallel output word alignment is achieved by tuning the bitslip signal (FIG. 1) to get an expected output pattern, for example 4'b1001 for the above mentioned training sequence. Each signal in the parallel input group is tuned with the above mentioned procedure with the same expected output to get aligned in both bit and word level.

One problem using the method described above is it may result in one or more bits delay. One example is the timing diagram shown in FIG. 3. Two input signals a and b in 310 have accompanied DDR clock. Data signals a and b have transition period such as periods 304, 306, 308, and open-eye periods such as period 312. Conventional systems would first perform searches for first transition period, which, when starts from edge 302, the first detected transition period for signal a will be period 306, while for signal b will be period 308. The delay tuning results in misalignment in 320, where i-th bit from signal a is aligned with (i−1)-th bit from signal b. Bit-level misalignment may result in word-level misalignment in the subsequent step, where there might be one word different for signals after ISerDes, even though the output pattern from training sequence input is the same.

SUMMARY

A source synchronous signal synchronization system includes a differential signal receiver; a tunable input delay element coupled to the receiver; an input serializer/deserializer (ISerDes) coupled to the tunable input delay element; an alignment unit coupled to the ISerDes; and a delay control unit coupled to the tunable input delay, the ISerDes, and the alignment unit.

Implementations of the above system may include one or more of the following. The alignment unit can be a Pseudo-Random Bit Sequence (PRBS) error detector. The data window centering can be based on a PRBS pattern. The bit alignment can be based on a PRBS pattern. The PRBS pattern can have no delay, wherein the bit alignment is achieved by having no delay in the received serial signals. The PRBS pattern can have a predetermined delay, wherein the bit alignment is achieved by tuning the bits to the predetermined delay. The delay control unit selects a tap from continuous zero error taps. The delay control unit selects a tap with the lowest bit error rate (BER). The alignment unit can be a word aligning block. The word aligning block works with the tunable input delay to reach desired output pattern. The delay control unit achieves data window centering by searching for a statistically stable period and selecting a middle tap for the statistically stable period. The delay tuning is based on one or more bits of the ISerDes. A bit-level alignment can be processed after data window centering. The bit-level alignment can be achieved by tuning input delay in bit period increment to have taps used for each signal having a predetermined skew range. The bit-level alignment can be achieved by tuning an equivalent serial PRBS distance to a predetermined value. The bit-level alignment can be achieved by a training sequence where each signal has same input. The bit-level alignment can be checked by having identical outputs on all ISerDes outputs. The bit-level alignment can be checked by having a different word alignment mode.

Advantages of the preferred embodiment may include one or more of the following. The system avoids bits delay and/or bit-level misalignment. The system also eliminates constraints arising from the clear-open eye assumption. In case there is certain signal which does not have its eye completely open, but still have acceptable bit error ratio (BER), the system avoids the infinite loop resulting from looking for the open-eye. The preferred embodiment provides a practical scheme for data alignment for system with high-speed parallel data input, to lower the requirement to inter-signal skew and PCB routing complexity. The system can tune the center of data window to a desired clock edge to achieve bit alignment among signals in parallel data group, and further guarantee word alignment if there is a deserializer following the input.

DESCRIPTION

Figure 1:
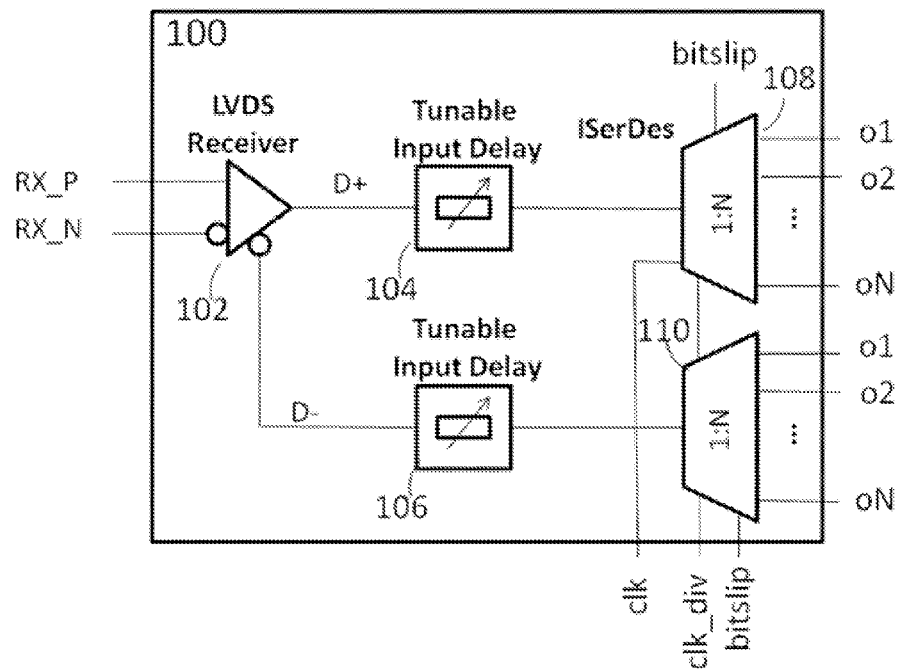
FIG. 1 shows elements of an example device input interface.
Figure 2:
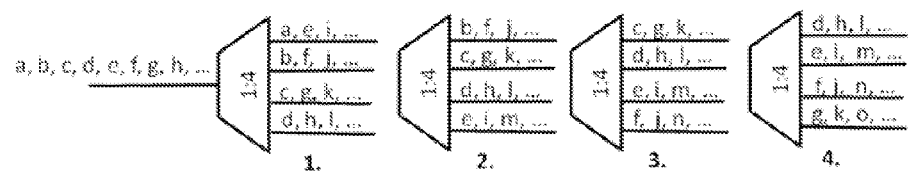
FIG. 2 shows various aligning modes of an ISerDes.
Figure 3:
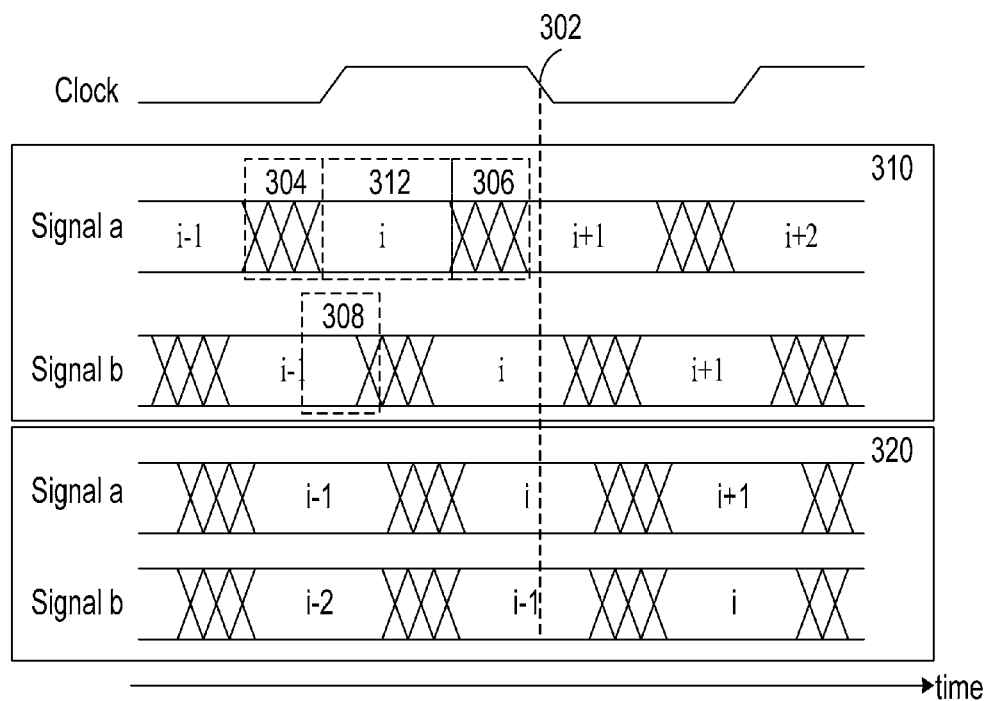
FIG. 3 shows an exemplary timing diagram.
Figure 4:
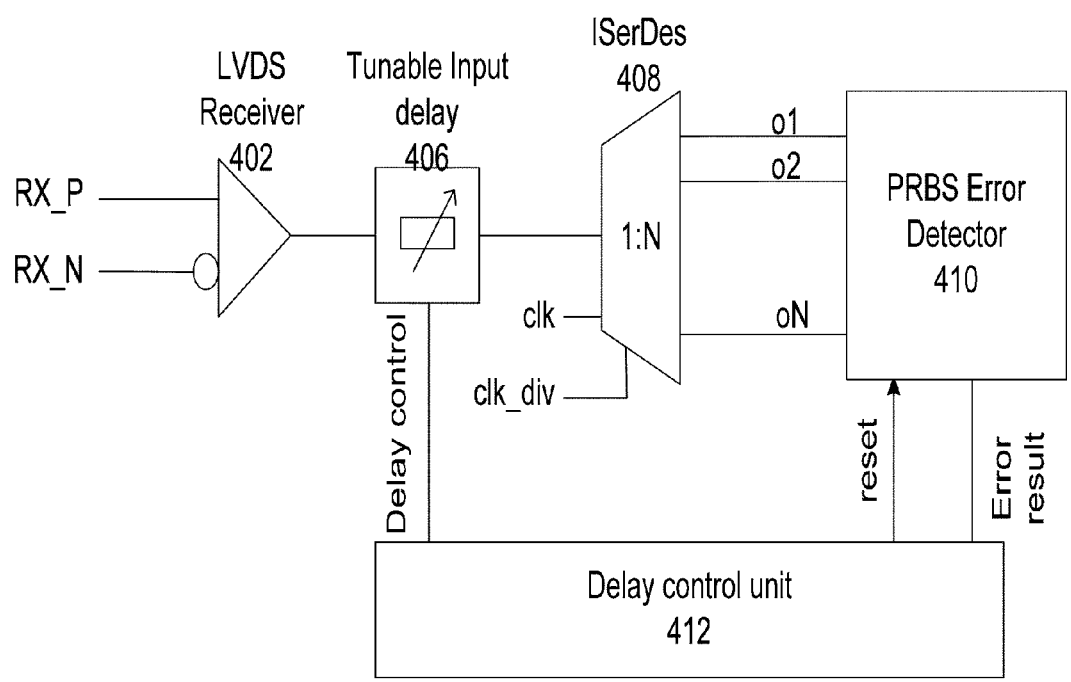
FIG. 4 shows an exemplary delay tuning circuit block diagram using PRBS (Pseudo-Random Bit Sequence).

FIG. 4 shows an exemplary delay tuning circuit block diagram using PRBS (Pseudo-Random Bit Sequence). The PRBS is used as an input to scan for a BER of a received signal with a different tap value. The delay range by the scanned number of taps may be equal to or larger than bit period. The system of FIG. 4 includes an LVDS receiver 402 for differential signals RX_P/RX_N. The receiver 402 drives a tunable input delay element 406 which can be tuned from no delay to a known delay which is determined by the maximum number of taps and the delay of each tap. The output of the tunable input delay 406 is provided to an ISerDes 408 for serial to parallel conversion. The ISerDes 408 is connected to an RPBS error detector 410 to check for received signal error rate. A delay control unit 412 uses the error detector 410's result to tune the tunable input delay 406 for data input window adjustment.

Initially, the tunable input delay 406 is set to zero (no delay), and the BER result is read from the error detector 410 after reset and running for pre-configured time period T. The system saves the BER result for later usage. The system then increases the delay by one, resets error detector 410 and saves the testing result obtained after the period T. The system keeps increasing the number of delay taps and repeats the reset/read/save operation after each tuning, until the system reaches the pre-configured number of taps. After this operation a tap-to-BER mapping table can be obtained, such as the exemplary mapping shown in Table 1.

TABLE 1

Example BER to number-of-delay-taps

| | Taps | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| BER | 0.5 | 0.5 | 0.4 | 0.1 | 0.0 | 0.0 | 0.0 | 0.0 | 0.0 | 0.2 | 0.4 | 0.5 |

In the example of Table 1, two cases can be seen. In the first case, the result BER first decreases, and after reaching certain taps, the BER is either zero (error free) or some low number. By adding more taps, the BER increases. This means the first center of data window lies in between the starting and ending point of the tried delay taps. The system can take the tap with either lowest BER, or the middle one of some continuous zero BER taps. For example, the delay can be set to 6-taps in Table 1. The second case is that the BER starts from either zero or a low number, and then continues to increase as the number of taps increases. After reaching certain number of taps, the BER decreases the same way as in the first case. The delay can be set to the tap with lowest BER during the scan, or, in case there are multiple error-free delay taps including zero tap, the system may search for the middle of the second signal window with tap P, then use N−P where N*one-tap-delay which is approximately a bit period when (N−P)>=0, or P when N−P<0. In practical case, when a real-time adjustment is needed to compensate for temperature and/or voltage variation, usually the second window is preferred to enable the adjustment to left side (fewer delay), for both cases discussed above.

The system checks for final alignment after input delay tuning, and adjust accordingly if there is misalignment. Statistic is used instead of one-time value to look for center of the data window. Thus, the system can be used even when a clear-open eye is not available. The system checks for signal relationship to guarantee the signals are well aligned. The signal relationship can be checked in either serial mode, i.e., when no ISerDes presents, by comparing the received data relationship between two signals; or by tuning the output to different alignment mode, check whether there is difference between each two signals.

Figure 5:
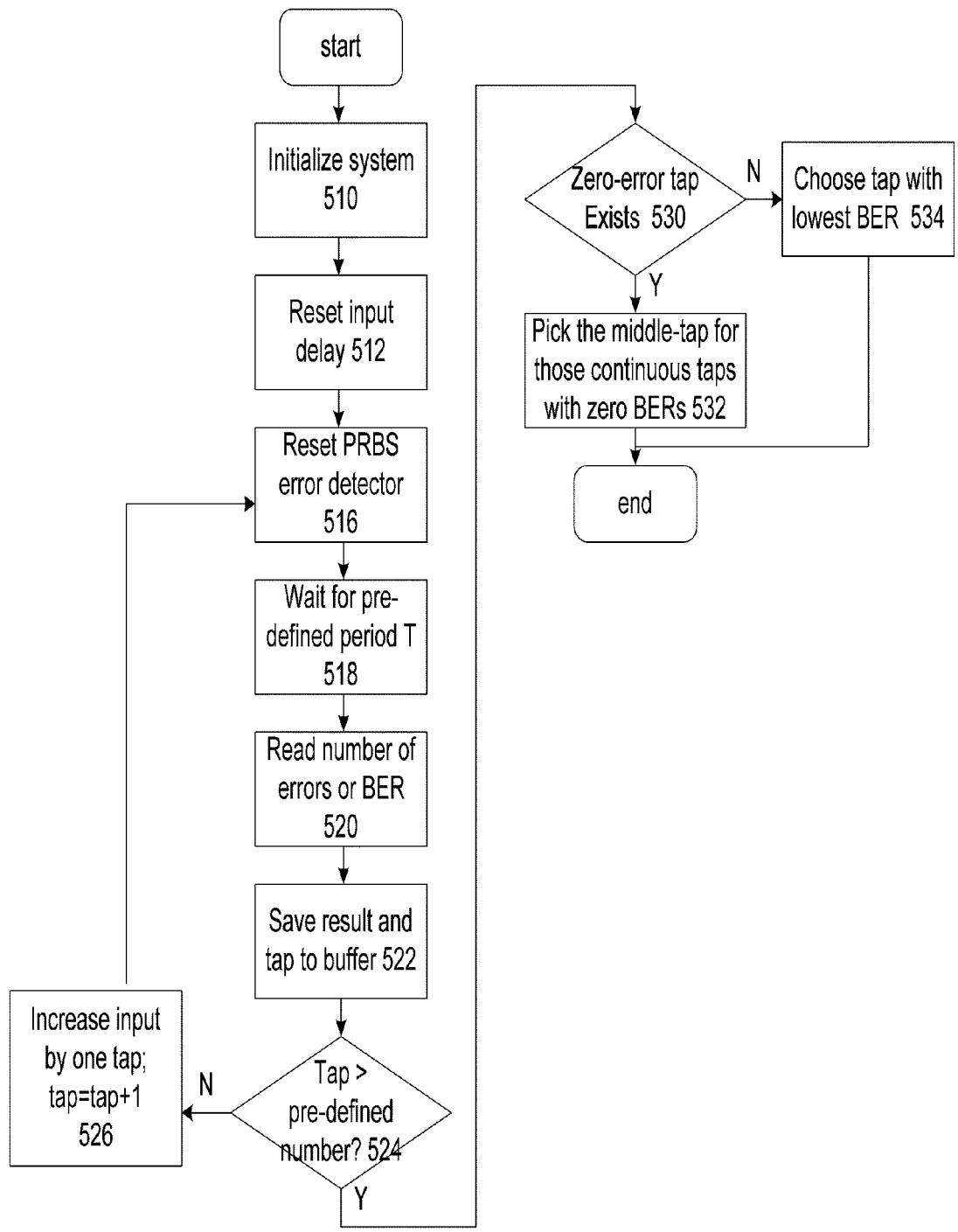
FIG. 5 shows an exemplary flow-chart with PRBS-based input delay adjustment.

FIG. 5 shows an exemplary flow-chart with PRBS-based input delay adjustment. In this process, the system is initialized in 510. The input delay is reset in 512. The PRBS error detector 410 is reset in 516. The process then waits a predetermined period T in 518. The process reads the number of errors or BER in 520. The result and tap information are saved in a buffer 522. Next, the process checks if the tap is greater than a predetermined number in 524, and if not, the tap is incremented in 526 and the process loops back to 516. Alternatively, from 524, the process checks for a zero-error tap in 530. If one exists, the process selects the middle tap from continuous taps with zero BERs in 532. Alternatively, if no zero error tap is available, the process selects a tap with the lowest BER in 534.

The embodiment using PRBS input can be applied to circuit either with or without ISerDes. Another embodiment when ISerDes is present is using training pattern, to search for stable period and transition period when tuning the input delay. The length of training pattern can be the same as ISerDes output bit width, for example, when 1:4 ISerDes is used, the training pattern can be 4'b1100. This is also the pattern used in other embodiments shown in FIG. 6.

Figure 6:
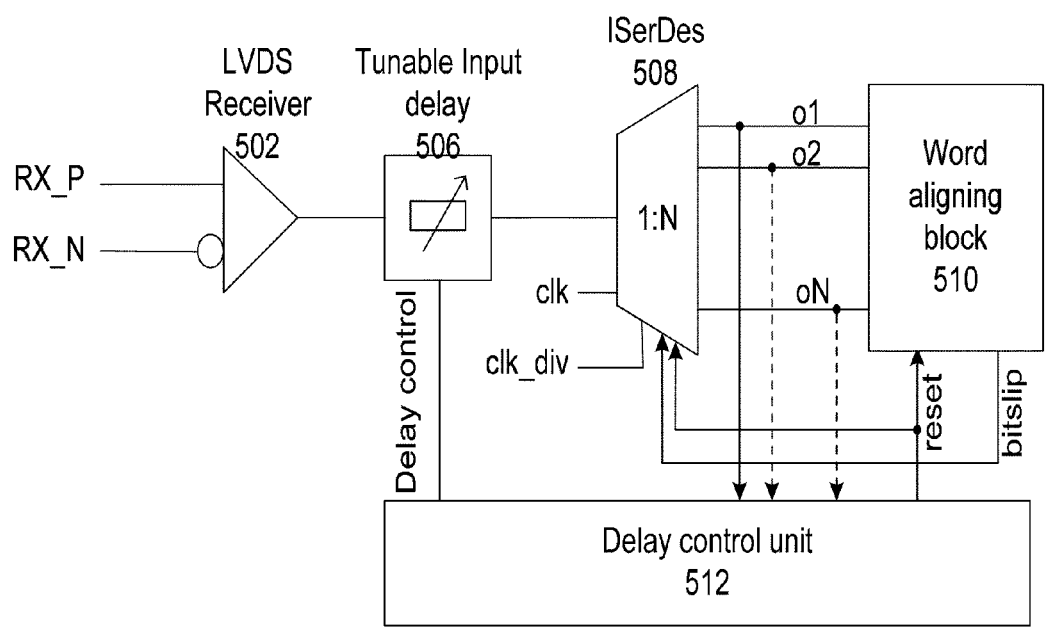
FIG. 6 shows another exemplary delay tuning circuit block diagram.

Comparing FIG. 6 with FIG. 4, a word aligning block 510 replaces the PRBS error detector 410. A delay control unit 512 takes input from an ISerDes block 508 to check the result, rather than reading result output from error detection block 410 as done in FIG. 4. A bit aligning state machine searches for a pre-defined pattern, such as pattern 4'b1100, until the control unit 512 reaches a statistically stable input, for example when the output from the ISerDes 508 is always 4'b1100, or the percentage is larger than a pre-defined threshold value. The delay control unit 512 keeps monitoring the output from the ISerDes 508, or signal align_done from 510 which indicates the success of bit alignment. There can be one or more signals connected from the ISerDes 508 output to the delay control unit 512. In one embodiment, the highest bit is connected; in another embodiment, the highest two bits are connected. In case the highest two bits from ISerDes 508 is connected to delay control unit 512, delay control unit 512 will be expecting for statistically stable 2'b11, when 4'b1100 is the expected parallel pattern. When unable to get a stable output from the ISerDes 508 or when the align_done signal (from word aligning block 510 to delay control unit 512) is not valid after a certain period, the control unit 512 may increase the input delay and reset word the aligning block 510.

After the ISerDes 508 reaches an expected stable output (identified as step 1), the bit aligning state machine will stop operation, while the delay control unit 512 will monitor the ISerDes 508's output through its connected signal(s), as it increases input delay (identified as step 2). The monitored pattern is also by statistics, that is, in given time period, if pattern A is detected for K times with K>H, where H is pre-defined threshold, then the pattern is treated as A; if no pattern is detected for times larger than H, it is treated as transition period. In case there are delay adjustment in step 1 to reach expected pattern, those number of taps will be treated as transition period as well. The delay control unit 512 combines the result from step 1 and step 2 to form a table, such as the example shown in Table 2. Similar to the procedure given in embodiment using PRBS, by treating stable pattern as zero BER, the system can calculate the number of taps to align to center of data window. For example, with the exemplary result in Table 2, the delay can be set to 5-tap in this example.

TABLE 2

Delay control unit 512's result table with different number of delay taps

| | | | | Taps | | | | | |
|---|---|---|---|---|---|---|---|---|---|
| 0 | 1 | 2 | 3 | 4 | 5 | 6 | 7 | 8 | 9 |
| State 11 | 11 | TRN | 10 | 10 | 10 | 10 | 10 | 00 | 00 |

Figure 7:
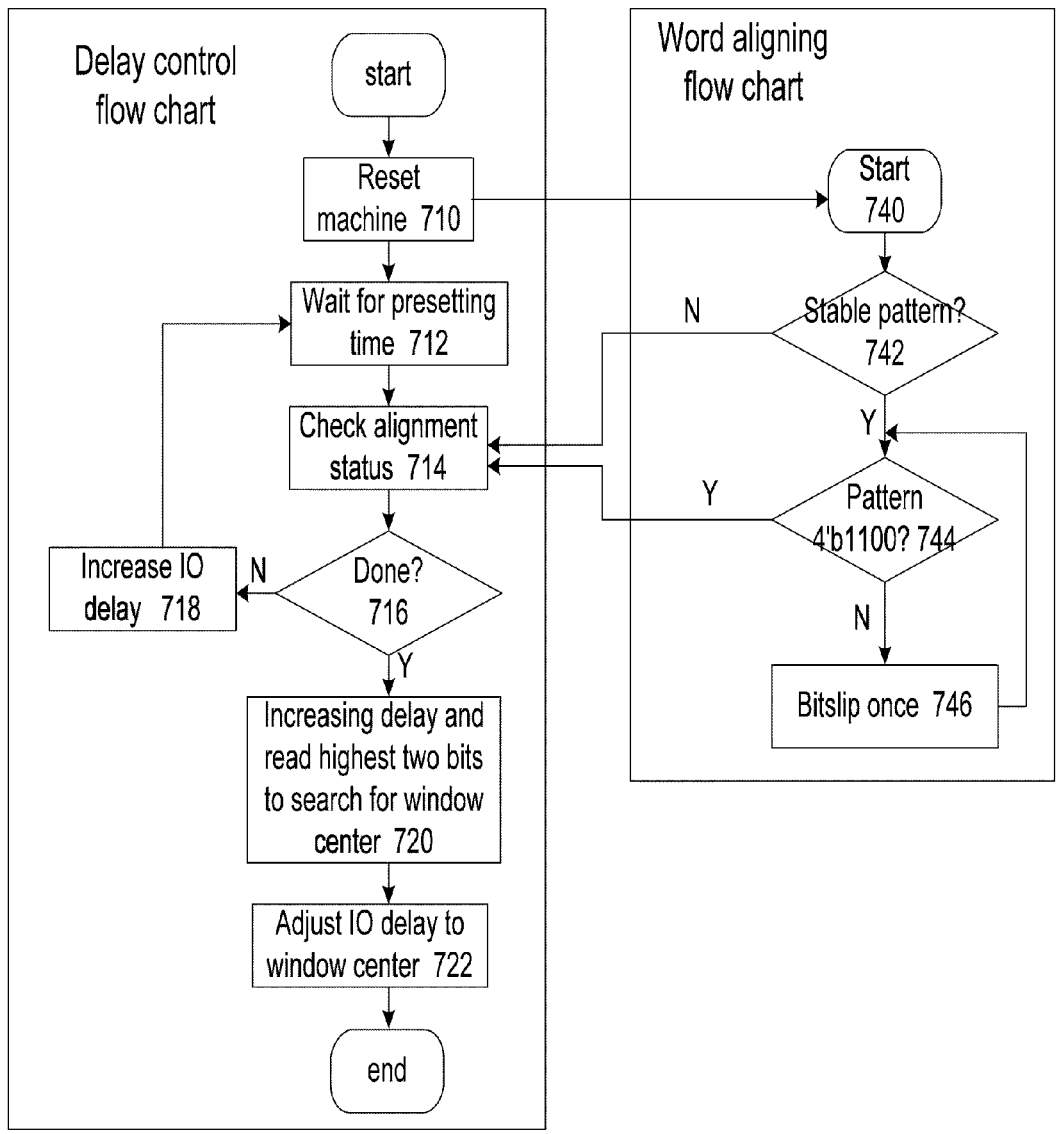
FIG. 7 shows an exemplary flow-chart with a training sequence-based input delay adjustment.

FIG. 7 shows an exemplary flow-chart with a training sequence-based input delay adjustment. In this process, the system is initialized in 710. The presetting time is reset in 712. The process checks alignment status in 714 and 716. If alignment is not done, the process increases the input output delay in 718 and loops back to 712. Alternatively, if aligned, the process increases the delay and reads a predetermined number of bits (such as highest two bits) to search for a window center in 720. The process adjusts the IO delay to the window center in 722.

From 710, the process also starts a word alignment process 740. The process looks for a stable pattern in 742. If the pattern is unstable, the process proceeds to 714. Alternatively, if the patter is stable, the process checks for a predetermined pattern (such as 4'b1100) in 744. If the pattern matches, the process continues to 714. If the pattern does not match, the process performs a bitslip in 746 and loops back to 744.

In sum, when input delay tuning is finished, the process checks input pattern for input alignment. In the embodiment using PRBS, the process sends the same PRBS pattern to the input under test, with or without pattern delay, and then checks the captured data to see whether received signals have same pattern delay. For example, in one example where ($2^7-1$) PRBS is used, the process may capture 7-bit data to guarantee that it sees the unique pattern (in case <7 bits are captured, there may be more than one same-patterns within ($2^7-1$) continuous bits). The process checks whether the relative delay is expected. If not, the input signals are not aligned, and signals with less delay is increased by B*D-tap, where B is the number of bit-delay and D-tap provides approximately one bit period delay, so that that corresponding signal will be delayed for B bits.

In another embodiment, if parallel output after ISerDes is available, a training pattern can be used. Each transmitter can transmit the same pattern (no delay), and the process may slip the ISerDes for N times where N is the deserializing ratio of each ISerDes. If the signals are aligned then the parallel output among different signals for different slipping will match; otherwise, if due to slipping there is a difference, additional input delay adjustment is needed. The system can adjust by incrementing or decrementing the unit of D-tap, which, as mentioned above, provides one bit period delay.

In a further embodiment, a PRBS pattern can be used in case with ISerDes. In one embodiment, the transmitter may send same pattern (no delay) to all the signals, and the receiver side can use the same comparison scheme as mentioned above. In another embodiment, there may be known delay in the transmitted signals, and it is needed to calculate the received signals delay difference. This can be achieved by either take all the parallel output and recover the original PRBS pattern, then compare the delay difference; or, by taking PRBS output from one signal and check whether the delay is as expected.

In yet another embodiment, the input signals have source synchronous clock. In another embodiment, the clock can be from other source with no frequency offset than data signals. If the data skew can be known, one embodiment for bit-level alignment can be done by tuning the input delay (in units of bit period) to have skew between the two signals to a predetermined range. For example, if signals a and b have a skew smaller than W, where W<bit period (by tap), after data window centering, the system can adjust one window to have a tap_a-tap_b<W, without checking the output pattern.

In another embodiment, the system limits the skew to certain range, the data can be aligned by first searching for center of each data window, and then adjust each data (in step of bit period) to within that limit.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device.

By way of example, a block diagram of a computer to support the system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A source synchronous signal synchronization system, comprising:
   a. a differential signal receiver;
   b. a tunable input delay element coupled to the receiver;
   c. an input serializer/deserializer (ISerDes) coupled to the tunable input delay element;
   d. an alignment unit coupled to the ISerDes; and
   e. a delay control unit coupled to the tunable input delay, the ISerDes, and the alignment unit;
   wherein the alignment unit comprises a Pseudo-Random Bit Sequence (PRBS) error detector, bit alignment is based on a PRBS pattern, and the PRBS pattern has a predetermined delay, wherein the bit alignment is achieved by tuning the bits to the predetermined delay.

2. The system of claim 1, wherein data window centering is based on the PRBS pattern.

3. The system of claim 1, wherein the PRBS pattern has no delay, wherein the bit alignment is achieved by having no delay in the received serial signals.

4. The system of claim 1, wherein the delay control unit selects a tap from continuous zero error taps.

5. The system of claim 1, wherein the delay control unit selects a tap with the lowest bit error rate (BER).

6. The system of claim 1, wherein the system is based on training sequence, and the alignment unit comprises a word aligning block.

7. The system of claim 6, wherein the word aligning block works with the tunable input delay to reach a statistically constant output.

8. The system of claim 6, wherein the delay control unit achieves data window centering by searching for a statistically stable period and selecting a middle tap for the statistically constant period.

9. The system of claim 1, wherein delay tuning is based on one or more bits of the ISerDes.

10. The system of claim 1, wherein a bit-level alignment is processed after data window centering.

11. The system of claim 1, wherein a bit-level alignment is achieved by tuning input delay in bit period increment to have taps used for each signal having a predetermined skew range.

12. The system of claim 11, wherein the bit-level alignment is achieved by tuning an equivalent serial PRBS distance to a predetermined value.

13. The system of claim 12, wherein the bit-level alignment is checked by having identical outputs on all ISerDes outputs.

14. The system of claim 11, wherein the bit-level alignment is achieved by a training sequence where each signal has same input.

15. The system of claim 14, wherein the bit-level alignment is checked by having a different word alignment mode.

16. A source synchronous signal synchronization system, comprising:
   a. a differential signal receiver;
   b. a tunable input delay element coupled to the receiver;
   c. an input serializer/deserializer (ISerDes) coupled to the tunable input delay element;
   d. an alignment unit coupled to the ISerDes; and
   e. a delay control unit coupled to the tunable input delay, the ISerDes, and the alignment unit;
   wherein the word aligning block works with the tunable input delay to reach a statistically constant output and the system is based on training sequence, and the alignment unit comprises a word aligning block.

17. A source synchronous signal synchronization system, comprising:
   f. a differential signal receiver;
   g. a tunable input delay element coupled to the receiver;
   h. an input serializer/deserializer (ISerDes) coupled to the tunable input delay element;
   i. an alignment unit coupled to the ISerDes; and
   j. a delay control unit coupled to the tunable input delay, the ISerDes, and the alignment unit;
   wherein the bit-level alignment is achieved by tuning an equivalent serial Pseudo-Random Bit Sequence (PRBS) distance to a predetermined value and a bit-level alignment is achieved by tuning input delay in bit period increment to have taps used for each signal having a predetermined skew range.

* * * * *